United States Patent
Shiraishi et al.

(10) Patent No.: US 9,148,948 B2
(45) Date of Patent: Sep. 29, 2015

(54) ELECTRONIC CONTROL DEVICE INCLUDING INTERRUPT WIRE

(75) Inventors: Ryoichi Shiraishi, Obu (JP); Toru Itabashi, Anjo (JP); Takahiko Furuta, Kasugai (JP); Yuuki Mikami, Kariya (JP); Hiroaki Nakamura, Nagaokakyo (JP); Shigeki Nishiyama, Nagaokakyo (JP)

(73) Assignees: DENSO CORPORATION, Kariya (JP); Murata Manufacturing Co., Ltd., Kyoto-fu (JP)

( * ) Notice: Subject to any disclaimer, the term of this patent is extended or adjusted under 35 U.S.C. 154(b) by 531 days.

(21) Appl. No.: 13/362,327

(22) Filed: Jan. 31, 2012

(65) Prior Publication Data

US 2012/0200973 A1 Aug. 9, 2012

(30) Foreign Application Priority Data

Feb. 4, 2011 (JP) .................................. 2011-22925

(51) Int. Cl.
*H02H 5/04* (2006.01)
*H05K 1/02* (2006.01)
*H01H 85/046* (2006.01)

(52) U.S. Cl.
CPC ............ *H05K 1/0265* (2013.01); *H05K 1/0293* (2013.01); *H01H 85/046* (2013.01); *H05K 2201/09263* (2013.01);
(Continued)

(58) Field of Classification Search
CPC .... H01H 85/044; H01H 85/046; H01H 85/08
USPC .......................................... 361/104
See application file for complete search history.

(56) References Cited

U.S. PATENT DOCUMENTS 3,805,208 A * 4/1974 McAlister ...................... 337/228
5,668,522 A * 9/1997 Kondo et al. .................. 337/198
(Continued)

FOREIGN PATENT DOCUMENTS

JP U-52-168254 12/1977
JP U-54-159163 11/1979
(Continued)

OTHER PUBLICATIONS

Office Action mailed Nov. 13, 2012 in corresponding JP Application No. 2011-022929 (and English translation).
(Continued)

*Primary Examiner* — Thienvu Tran
*Assistant Examiner* — Christopher Clark
(74) *Attorney, Agent, or Firm* — Posz Law Group, PLC

(57) ABSTRACT

An electronic control device includes a substrate, component-mounted wires disposed on the substrate, electronic components mounted on the respective component-mounted wires, a common wire disposed on the substrate and coupled with each of the electronic components, and an interrupt wire coupled between one of the component-mounted wires and the common wire. The interrupt wire melts in accordance with heat generated by an overcurrent. The interrupt wire includes a first wire section and a second wire section shorter than the first wire section. The first wire section and the second wire section is coupled with each other at a predetermined angle that is determined so that one of the wire sections is coupled with the common wire and the other is coupled with the one of the component-mounted wires.

7 Claims, 14 Drawing Sheets

(52) U.S. Cl.
CPC ............... *H05K 2201/09727* (2013.01); *H05K 2201/09772* (2013.01); *H05K 2201/10181* (2013.01)

(56) References Cited

U.S. PATENT DOCUMENTS

| | | | | |
|---|---|---|---|---|
| 5,929,741 | A | | 7/1999 | Nishimura et al. |
| 5,982,268 | A | * | 11/1999 | Kawanishi .................... 337/297 |
| 6,002,322 | A | * | 12/1999 | Krueger et al. ............... 337/297 |
| 6,163,244 | A | * | 12/2000 | Endo et al. .................... 337/160 |
| 6,563,684 | B2 | * | 5/2003 | Kanamaru et al. ............ 361/103 |
| 6,933,591 | B1 | | 8/2005 | Sidhu et al. |
| 2003/0048620 | A1 | * | 3/2003 | Nishimura et al. ........... 361/760 |
| 2004/0184211 | A1 | * | 9/2004 | Bender et al. ................. 361/104 |
| 2004/0189436 | A1 | * | 9/2004 | Hill ................................ 337/297 |
| 2005/0141164 | A1 | * | 6/2005 | Bender et al. ................. 361/104 |
| 2007/0019351 | A1 | * | 1/2007 | Whitney et al. ............... 361/104 |
| 2008/0100411 | A1 | * | 5/2008 | Tofigh et al. .................. 337/163 |
| 2008/0239684 | A1 | * | 10/2008 | Yamasaki ...................... 361/779 |
| 2009/0167480 | A1 | * | 7/2009 | Wiryana et al. ............... 337/297 |
| 2011/0051388 | A1 | | 3/2011 | Luppold et al. |
| 2012/0200970 | A1 | * | 8/2012 | Itabashi et al. ............... 361/93.8 |
| 2012/0200972 | A1 | * | 8/2012 | Furuta et al. .................. 361/104 |
| 2012/0200974 | A1 | * | 8/2012 | Mikami et al. ................ 361/104 |
| 2012/0201010 | A1 | * | 8/2012 | Furuta et al. .................. 361/752 |
| 2012/0326832 | A1 | * | 12/2012 | Iwata et al. .................... 337/227 |
| 2013/0128406 | A1 | * | 5/2013 | Colby et al. ................... 361/104 |
| 2014/0253282 | A1 | * | 9/2014 | Itabashi et al. ................ 337/416 |
| 2014/0307359 | A1 | * | 10/2014 | Mikami et al. ................ 361/104 |

FOREIGN PATENT DOCUMENTS

| | | |
|---|---|---|
| JP | U-54-177551 | 12/1979 |
| JP | 55-14731 | 1/1980 |
| JP | U-55-14730 | 1/1980 |
| JP | U-55-108776 | 7/1980 |
| JP | S62-107341 U | 7/1987 |
| JP | S64-013650 U | 1/1989 |
| JP | A-10-199395 | 7/1998 |
| JP | A-2000-003662 | 1/2000 |
| JP | A-2000-164992 | 6/2000 |
| JP | A-2003-019933 | 1/2003 |
| JP | A-2004-158377 | 6/2004 |
| JP | A-2006-114606 | 4/2006 |
| JP | 2007095592 A | 4/2007 |
| JP | A-2007-311467 | 11/2007 |
| JP | A-2008-060381 | 3/2008 |

OTHER PUBLICATIONS

Office Action mailed Nov. 13, 2012 in corresponding JP Application No. 2011-022926 (and English translation).
Office Action mailed Nov. 13, 2012 in corresponding JP Application No. 2011-022925 (and English translation).
Office Action mailed Nov. 13, 2012 in corresponding JP Application No. 2011-022924 (and English translation).
Office Action mailed Nov. 13, 2012 in corresponding JP Application No. 2011-022931 (and English translation).
Office Action mailed Nov. 13, 2012 in corresponding JP Application No. 2011-022927 (and English translation).
Office Action mailed Nov. 13, 2012 in corresponding JP Application No. 2011-022928 (and English translation).
Office Action mailed Nov. 13, 2012 in corresponding JP Application No. 2011-022930 (and English translation).
Office Action mailed Sep. 17, 2013 in corresponding JP Application No. 2013-002745 (and English translation).
Office Action mailed Nov. 19, 2013 in the corresponding JP application No. 2013-001731, which is the Divisional Application of JP No. 2011-022927.
Office Action mailed Jul. 23, 2013 in the corresponding JP application No. 2013-002744, which is Division Application of JP No. 2011-022928 (English translation).
Office Action mailed Jul. 2, 2013 issued in corresponding JP patent application No. 2011-022929 (and English translation).
Office Action mailed Jul. 2, 2013 issued in corresponding JP patent application No. 2011-022925 (and English translation).
Office Action mailed Jul. 2, 2013 issued in corresponding JP patent application No. 2011-022931 (and English translation).
Office Action mailed Jun. 19, 2015 in the corresponding DE application No. 10 2012 201 526.4 (with English translation).

* cited by examiner

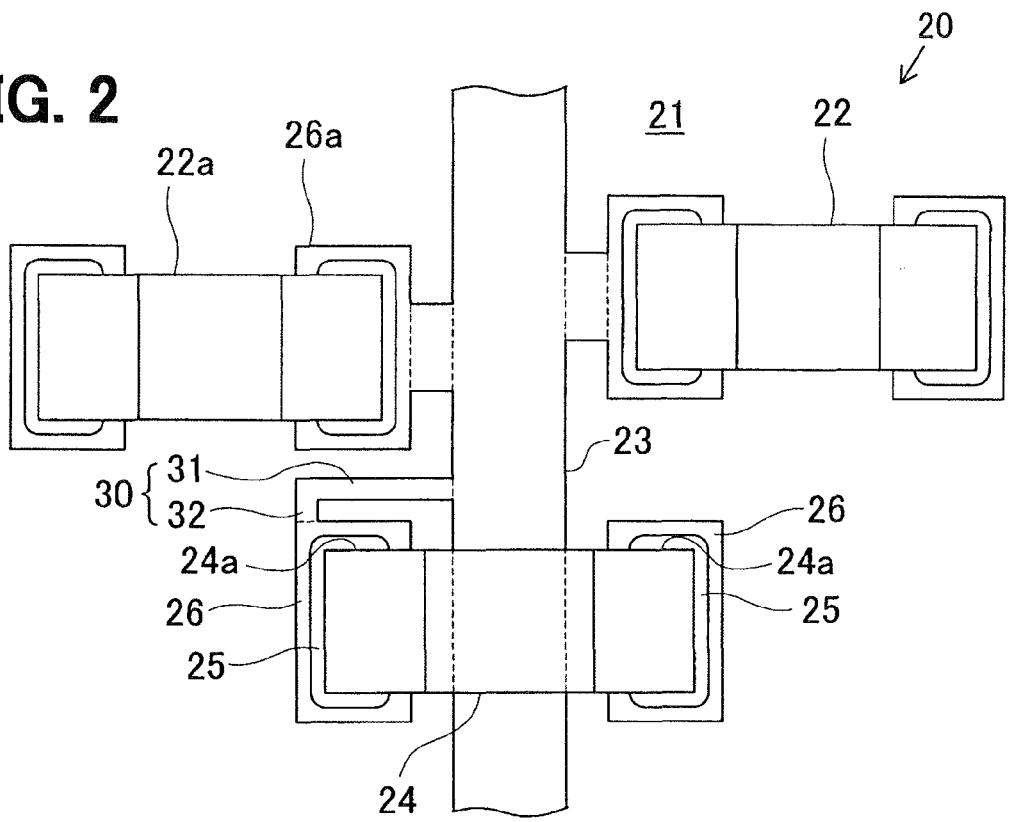
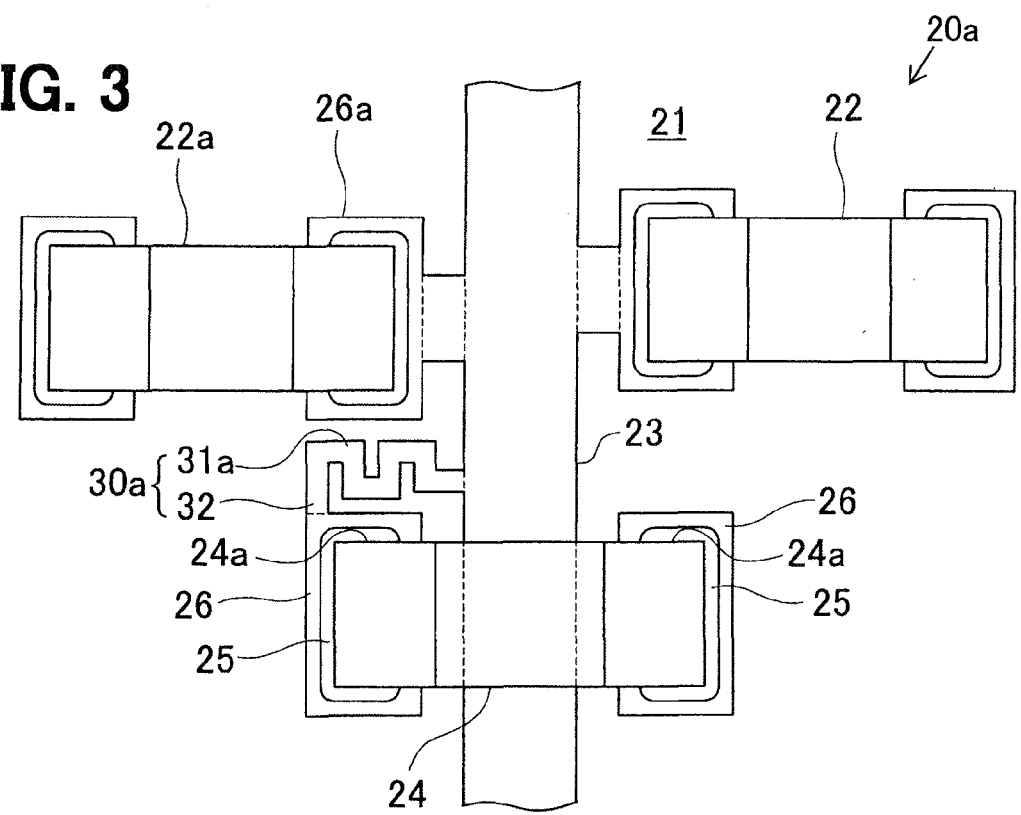

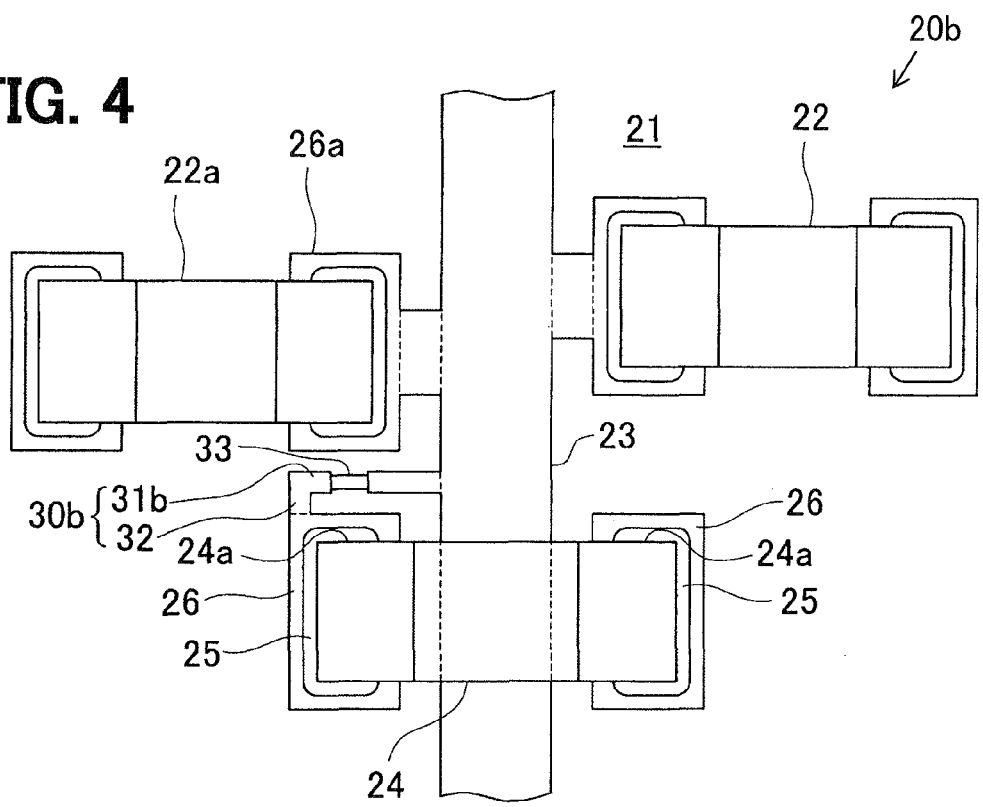
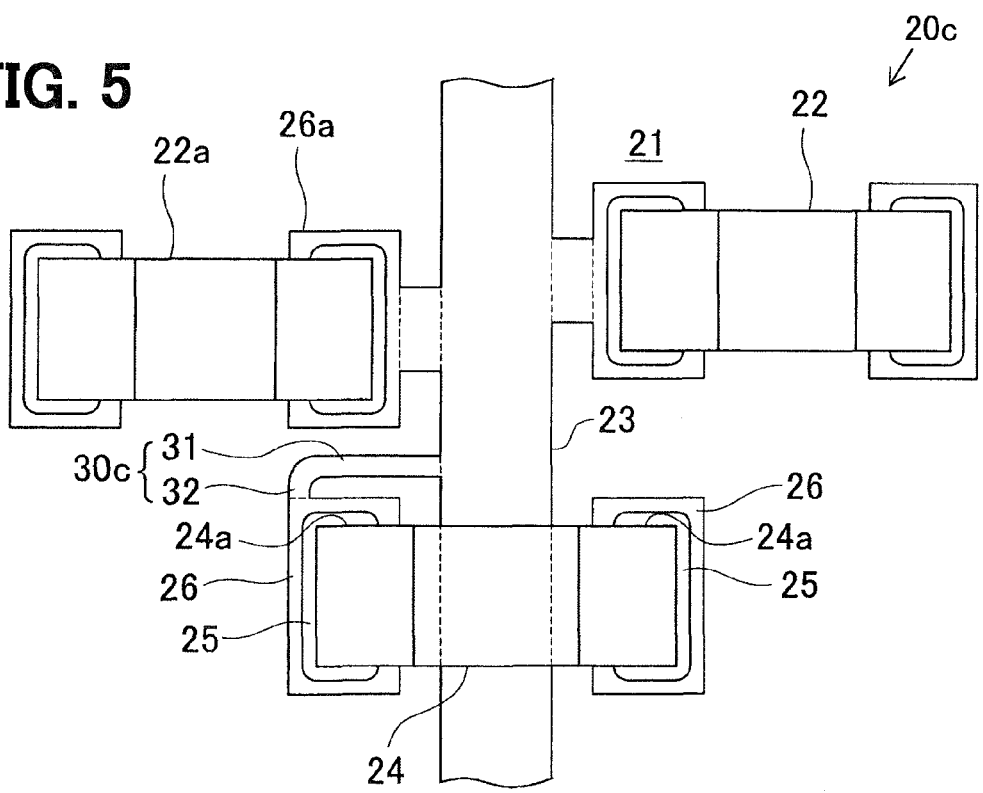

ELECTRONIC CONTROL DEVICE INCLUDING INTERRUPT WIRE

CROSS REFERENCE TO RELATED APPLICATIONS

The present application is based on and claims priority to Japanese Patent Application No. 2011-22925 filed on Feb. 4, 2011, the disclosure of which is incorporated herein by reference.

TECHNICAL FIELD

The present invention relates to an electronic control device including an interrupt wire for overcurrent protection.

BACKGROUND

Conventionally, an electronic control device includes a fuse in case of a fault in the electronic control device. In an electronic control device in which small components are densely arranged, because a short-circuit current generated at a short-circuit fault in the small components does not reach a high current, it takes a long time to interrupt by the fuse. Especially when a large fuse is used for protecting a plurality of electronic control devices so as to reduce the number of fuses and a cost, it takes a longer time. Thus, temperatures of the components may be increased at an interruption and a voltage drop in a power supply wire and the like may be caused for a long time. In contrast, in a common wire, such as a power supply wire (e.g., a battery path and a ground path), that supplies electric power required for operating many circuits and many components mounted in accordance with advancement and diversification of electronic control, a relatively high current flows. Thus, an interrupting current of a large fuse disposed in a common wire path is further increased, and the electronic control device does not secure a sufficient interruption performance at a short-circuit fault in each circuit or each component. The above-described issue becomes noticeable, for example, in an electronic control device for a vehicle used at a higher temperature and including many mounted devices.

JP-A-2007-311467 discloses a printed circuit board control device in which an interrupt wire is disposed in a power supply wire in each substrate. If an overcurrent flows, the interrupt wire melts and the power supply wire is interrupted in each substrate or each device.

The interrupt wire has properties, such as a resistance value, depending on a length. Thus, the length of the interrupt wire is determined based on a melting time and interrupt conditions. On a substrate in which components are densely mounted, a component-mounted wire, such as a land, on which an electronic component is mounted, and a common wire shared by a plurality of electronic components including the electronic component are disposed adjacent to each other. Thus, it is difficult to dispose an interrupt wire having a required length, in particular, an interrupt wire having a long length so as to be melted by a low current between the common wire and the component-mounted wire, and a mounting area may be increased by disposing the interrupt wire.

SUMMARY

In view of the foregoing problems, it is an object of the present invention to provide an electronic control device, a size of which can be reduced even with an interrupt wire.

An electronic control device according to an aspect of the present invention includes a substrate, a plurality of component-mounted wires disposed on the substrate, a plurality of electronic components mounted on the respective component-mounted wires, a common wire disposed on the substrate and coupled with each of the electronic components, and an interrupt wire coupled between one of the component-mounted wires and the common wire. The interrupt wire melts in accordance with heat generated by an overcurrent so as to interrupt a connection between the one of the component-mounted wires and the common wire via the interrupt wire. The interrupt wire includes a first wire section and a second wire section that is shorter than the first wire section. The first wire section and the second wire section are coupled with each other at a predetermined angle. The predetermined angle is determined so that one of the first wire section and the second wire section is coupled with the common wire and the other is coupled with the one of the component-mounted wires.

In the electronic control device, the first wire section and the second wire section of the interrupt wire are coupled with each other at the predetermined angle so that one of the first wire section and the second wire section is coupled with the common wire and the other is coupled with the one of the component-mounted wires. Thus, a length of the interrupt wire can be reduced and a size of the electronic control device can be reduced compared with a case where the interrupt wire has a straight shape.

BRIEF DESCRIPTION OF THE DRAWINGS

Additional objects and advantages of the present invention will be more readily apparent from the following detailed description when taken together with the accompanying drawings. In the drawings:

FIG. 2 is a diagram showing a part of the traction control device according to the first embodiment;

FIG. 3 is a diagram showing a part of a traction control device according to a second embodiment of the present disclosure;

FIG. 4 is a diagram showing a part of a traction control device according to a third embodiment of the present disclosure;

FIG. 5 is a diagram showing a part of a traction control device according to a fourth embodiment of the present disclosure;

DETAILED DESCRIPTION

First Embodiment

Figure 1:
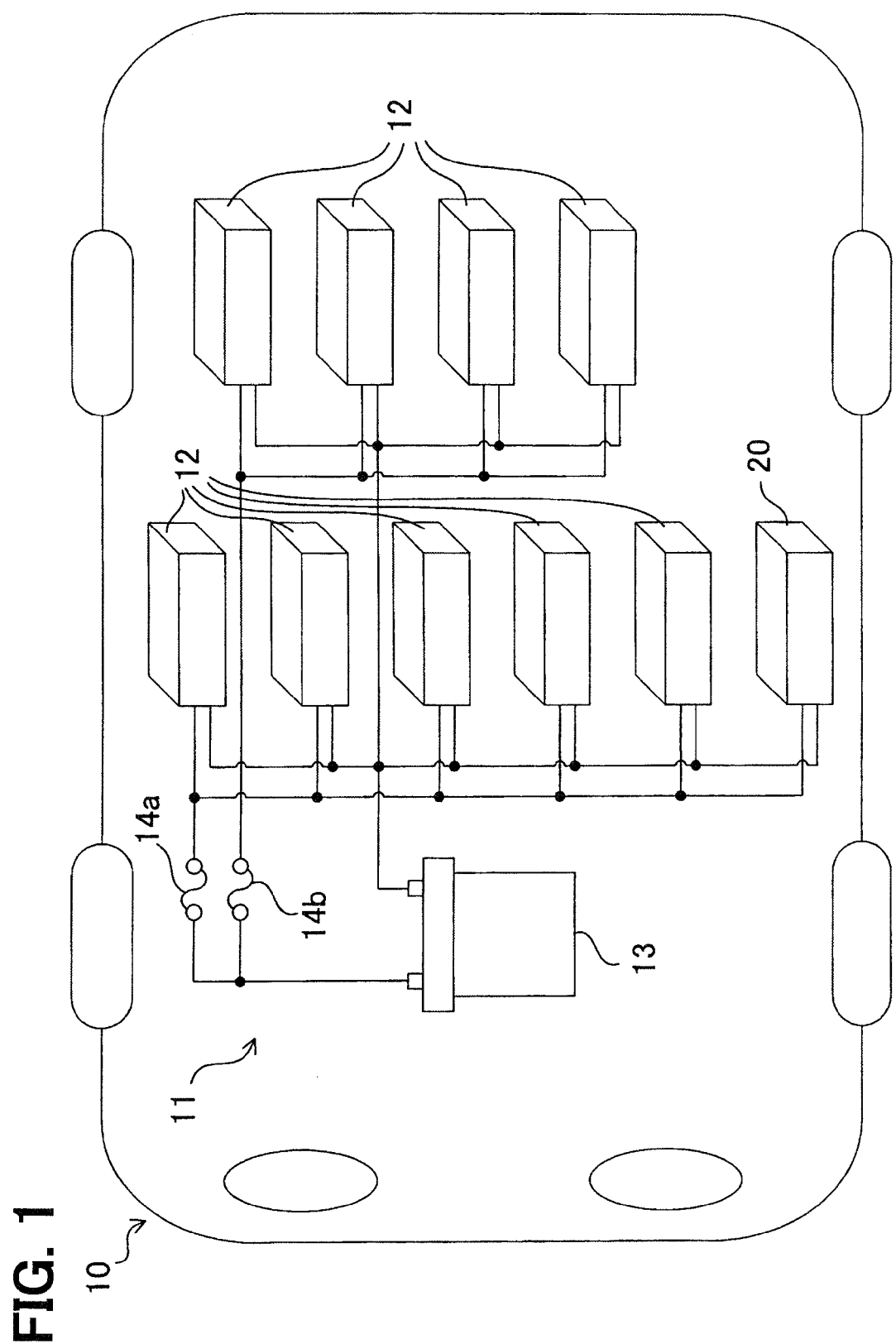
FIG. 1 is a block diagram showing a vehicle control system including a traction control device according to a first embodiment of the present disclosure.

An electronic control device according to a first embodiment of the present disclosure will be described with reference to drawings. The electronic control device according to the present embodiment can be suitably used as a traction control device 20 included in a vehicle control system 11. As shown in FIG. 1, the vehicle control system 11 includes a plurality of electronic control devices 12 that include the traction control device 20, an engine electronic control unit (ECU), a brake ECU, a steering ECU, a body ECU, a navigation device, and the like.

The traction control device 20 restricts an acceleration slip of a driving wheel. In a vehicle control such as a running control, the traction control device 20 is less important than other electronic control devices.

The electronic control devices 12 including the traction control device 20 are electrically coupled with a battery 13 via one of fuses 14a,14b used for overcurrent protection. The battery 13 is a direct-current power source. Because each of the fuses 14a, 14b is disposed on a power supply path for supplying electric power to many electronic control devices, each of the fuses 14a, 14b may be a large fuse for 15 A or 20 A. When one of the electronic control devices 12 coupled with the fuse 14a has abnormality and an overcurrent greater than a predetermined current value is generated, the fuse 14a blows out by the overcurrent, and a power supply via the fuse 14a is interrupted. Thus, an adverse influence to the other electronic control devices 12 can be restricted. In an example shown in FIG. 1, each of the electronic control devices 12 is electrically coupled with the battery 13 via one of the fuses 14a, 14b. However, all the electronic control devices 12 may also be electrically coupled with the battery 13 via a single fuse, or each of the electronic control devices 12 may also be electrically coupled with the battery 13 via one of more than two fuses.

The traction control device 20 according to the present embodiment will be described with reference to FIG. 2. The traction control device 20 includes a circuit substrate 21 housed in a casing (not shown). On the circuit substrate 21, a plurality of electronic components 22 for restricting an acceleration slip is densely-mounted on the circuit substrate 21. The circuit substrate 21 is electrically coupled with an external device and other electronic control devices 12 via, for example, a connector, and restricts an acceleration slip of the driving wheel based on a predetermined signal.

Each of the electronic components 22 on the circuit substrate 21 is electrically coupled with the power supply wire 23. The power supply wire 23 is coupled with the battery 13 by the power supply path via the fuse 14a and supplies electric power from the battery 13 to each of the electronic components 22. Thus, the power supply wire 23 is an example of a common wire shared by the electronic components 22.

One of the electronic components 22 on the circuit substrate 21 is a ceramic capacitor 24. The ceramic capacitor 24 may be formed by stacking a high-permittivity ceramic made of barium titanate and an internal electrode in layers for improving temperature characteristics and frequency characteristics, and thereby having a large capacity with a small size.

The ceramic capacitor 24 has outside electrodes 24a on either ends thereof. The outside electrodes 24a are mounted on respective lands 26. Thus, the lands 26 are coupled with each other via the ceramic capacitor 24. In order to achieve a densely mounting, the power supply wire 23 is disposed between the lands 26. The lands 26 can work as component-mounted wires. The outside electrodes 24a can work as terminals of the ceramic capacitor 24.

Between one of the lands 26 and the power supply wire 23, an interrupt wire 30 is coupled. The interrupt wire 30 melts by heat generated by an overcurrent and interrupts the electric connection between the land 26 and the power supply wire 23 via the interrupt wire 30. Thus, the interrupt wire 30 can achieve an overcurrent protection depending on the circuit substrate 21.

The interrupt wire 30 includes a first wire section 31 and second wire section 32 that is shorter than the first wire section 32. The first wire section 31 and the second wire section 32 are coupled to each other at a predetermined angle. The predetermined angle is determined so that the first wire section 31 is coupled with the power supply wire 23 and the second wire section 32 is coupled with the land 26. For example, the predetermined angle is 90 degrees. The second wire section 32 is coupled with a peripheral portion of the land 26 at a position distant from the outside electrode 24a of the ceramic capacitor 24 mounted on the land 26.

The interrupt wire 30 has a wire width sufficiently smaller than a wire width of the power supply wire 23. The wire width means a dimension in a direction that is perpendicular to a direction of electric current on a surface of the circuit substrate 21. For example, the interrupt wire 30 has a wire width within a range from 0.2 mm to 0.3 mm, and the power supply wire 23 has a wire width of 2 mm.

The electronic components 22 include electronic components 22a other than the ceramic capacitor 24. One of the electronic components 22a is coupled with a land 26a. In order to decrease a mounting area, the land 26a is disposed adjacent to the land 26 coupled with the interrupt wire 30 in such a manner that the interrupt wire 30 is disposed between the land 26a and the land 26.

In the traction control device 20 having the above-described configuration, for example, when a short-circuit fault occurs in the ceramic capacitor 24 and an overcurrent flows in the interrupt wire 30, the interrupt wire 30 generates heat in accordance with the overcurrent. When the generated heat becomes greater than a predetermined temperature, the interrupt wire 30 melts, and the electric connection via the interrupt wire 30 is interrupted. Accordingly, the other electronic components 22 coupled with the power supply wire 23 can be protected against the overcurrent. The current at interruption is not high enough to blow the fuse 14a. Thus, the damage of the traction control device 20 does not influence to the other electronic control devices 12 supplied with power via the fuse 14a. A time from generation of the overcurrent to the melting of the interrupt wire 30 is a few milliseconds, and a melting time of each of the fuses 14a, 14b is generally about 0.02 seconds. Thus, the overcurrent protection can be appropriately achieved even to an electronic control device or an electronic component that is required to improve a processing speed.

By bending the interrupt wire 30 at the predetermined angle, a wire length of the interrupt wire 30 can be increased compared with a case where the interrupt wire 30 has a straight shape while coupling the power supply wire 23 and the land 26. Accordingly, a required wire length of the interrupt wire 30 can be secured in a limited mounting area even when the interrupt wire 30 is disposed on the surface of the circuit substrate 21 on which the electronic components 22 are densely mounted.

Since the interrupt wire 30 is coupled with the peripheral portion of the land 26 at the position distant from the outside electrode 24a of the ceramic capacitor 24, the ceramic capacitor 24 is less likely to be affected by the heat generated at the interrupt wire 30. Furthermore, in a case where the electronic component 22 that generates heat is mounted on the land 26 instead of the ceramic capacitor 24, influence of the heat generated at the electronic component 22 on the interrupt wire 30 can be restricted.

Even when the land 26a is disposed adjacent to the land 26 in such a manner that the interrupt wire 30 is disposed between the land 26a and the land 26, the required wire length of the interrupt wire 30 can be secured. Thus, the size of the traction control device 20 can be decreased.

Even when the power supply wire 23 is disposed between a pair of lands 26, on which the ceramic capacitor 24 as one of the electronic components 22 is mounted, the predetermined angle is determined in accordance with positions of the power supply wire 23 and one of the land 26. Thus, the wire length of the interrupt wire 30 can be increased while coupling the power supply wire 23 and the land 26. Accordingly, the required wire length of the interrupt wire 30 can be secured, and the size of the traction control device 20 can be further decreased even when the interrupt wire 30 is disposed on the surface of the circuit substrate 21 on which the electronic components 22 are densely mounted.

The power supply wire 23 is coupled with the battery 13, which supplies power not only to the traction control device 20 but also to other electronic control devices 12, by the power supply path, and the fuse 14a for protecting the traction control device 20 and other electronic control devices 12 is disposed on the power supply path. Even when a short-circuit fault occurs in the traction control device 20 including the interrupt wire 30, the interrupt wire 30 melts. Thus, influence of the short-circuit fault on the power supply to other electronic control device 12 can be restricted.

Second Embodiment

A traction control device 20a according to a second embodiment of the present disclosure will be described with reference to FIG. 3.

The traction control device 20a includes an interrupt wire 30a. The interrupt wire 30a includes a first wire section 31a and a second wire section 32. The first wire section 31a has a meandering shape so as to secure a required wire length of the interrupt wire 30a within a limited mounting area.

Accordingly, the required wire length of the interrupt wire 30a can be secured more easily, and a size of the traction control device 20a can be decreased. The above-described configuration of the interrupt wire 30a may be applied to other embodiments and modifications.

Third Embodiment

A traction control device 20b according to a third embodiment of the present disclosure will be described with reference to FIG. 4.

The traction control device 20b includes an interrupt wire 30b. The interrupt wire 30b includes a first wire section 31b and a second wire section 32. The first wire section 31b includes a narrow portion 33 at a middle portion of an entire length of interrupt wire 30b including the first wire section 31b and the second wire section 32. The narrow portion 33 has a wire width narrower than the other portion of the first wire section 31.

Accordingly, when the interrupt wire 30b melts, the interrupt wire 30b is likely to melt at the narrow portion 33. Thus, a melted portion can be fixed while decreasing a size of the traction control device 20b. The above-described configuration of the interrupt wire 30a may be applied to other embodiments and modifications.

Fourth Embodiment

A traction control device 20c according to a fourth embodiment of the present disclosure will be described with reference to FIG. 5.

The traction control device 20c includes an interrupt wire 30c. The interrupt wire 30c includes a first wire section 31 and a second wire section 32. A connection portion of the first wire section 31 and the second wire section 32 has the same wire width as the first wire section 31 and the second wire section 32.

Thus, when the interrupt wire 30c melts, generated heat is likely to concentrate at a middle portion of an entire length of the interrupt wire 30c compared with end portions coupled with the power supply wire 23 or the land 26. Accordingly, when the interrupt wire 30c melts, the interrupt wire 30c is likely melt at the middle portion of the interrupt wire 30c. Thus, a melted portion can be fixed while decreasing a size of the traction control device 20c. The above-described configuration of the interrupt wire 30c may be applied to other embodiments and modifications.

Fifth Embodiment

Figure 6:
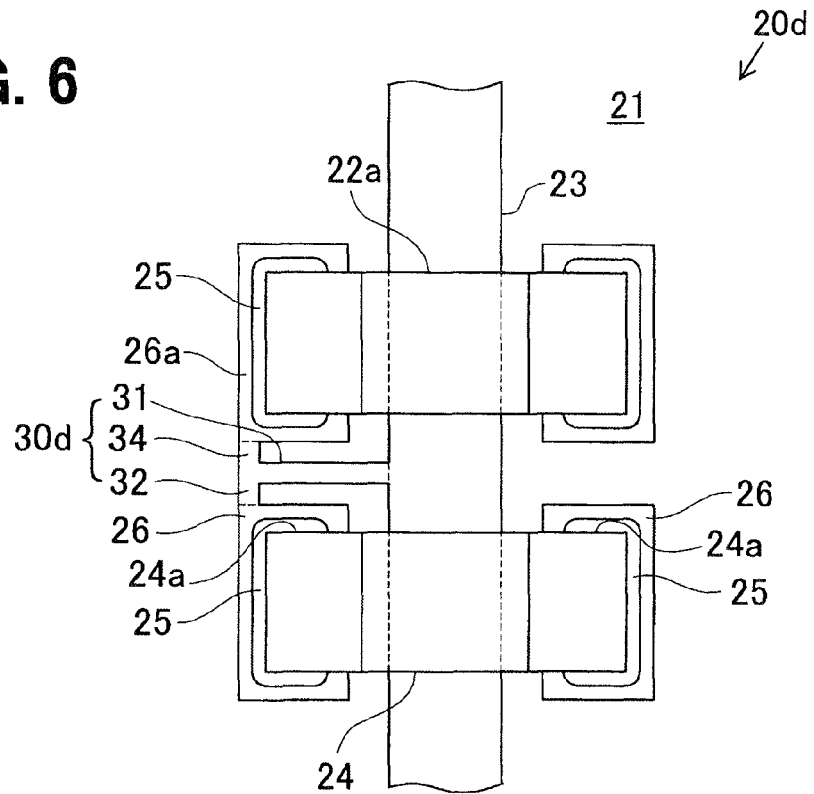
FIG. 6 is a diagram showing a part of a traction control device according to a fifth embodiment of the present disclosure.

A traction control device 20d according to a fifth embodiment of the present disclosure will be described with reference to FIG. 6.

The traction control device 20d includes an interrupt wire 30d. The interrupt wire 30d includes a first wire section 31, a second wire section 32 and a third wire section 34. The third wire section 34 is shorter than the first wire section 31. One end of the third wire section 34 is coupled with a connection portion of the first wire section 31 and the second wire section 32. The other end of the third wire section 34 is coupled with the land 26a of the electronic component 22a, which is different from the land 26 coupled with the second wire section 32.

The first wire section 31 is coupled with the power supply wire 23. Thus, the land 26a is coupled with the power supply wire 23 via the first wire section 31 and the third wire section 34 in the interrupt wire 30d. Accordingly, a part of the interrupt wire 30d is used for overcurrent protection of a plurality of electronic components 22. Thus, a mounting area of interrupt wires can be reduced and a size of the traction control device 20d can be decreased compared with a case where interrupt wires are provided for respective electronic components. Since the third wire section 34 is coupled with the connection portion of the first wire section 31 and the second wire section 32, the interrupt wire 30d can be shared by two or more electronic components 22. The above-described configuration of the interrupt wire 30d may be applied to other embodiments and modifications.

Sixth Embodiment

A traction control device 20e according to a sixth embodiment of the present disclosure will be described with reference to FIG. 7 and FIG. 8.

The traction control device 20e includes an interrupt wire 30e. The interrupt wire 30e includes a first wire section 35 and a second wire section 32.

Figure 7:
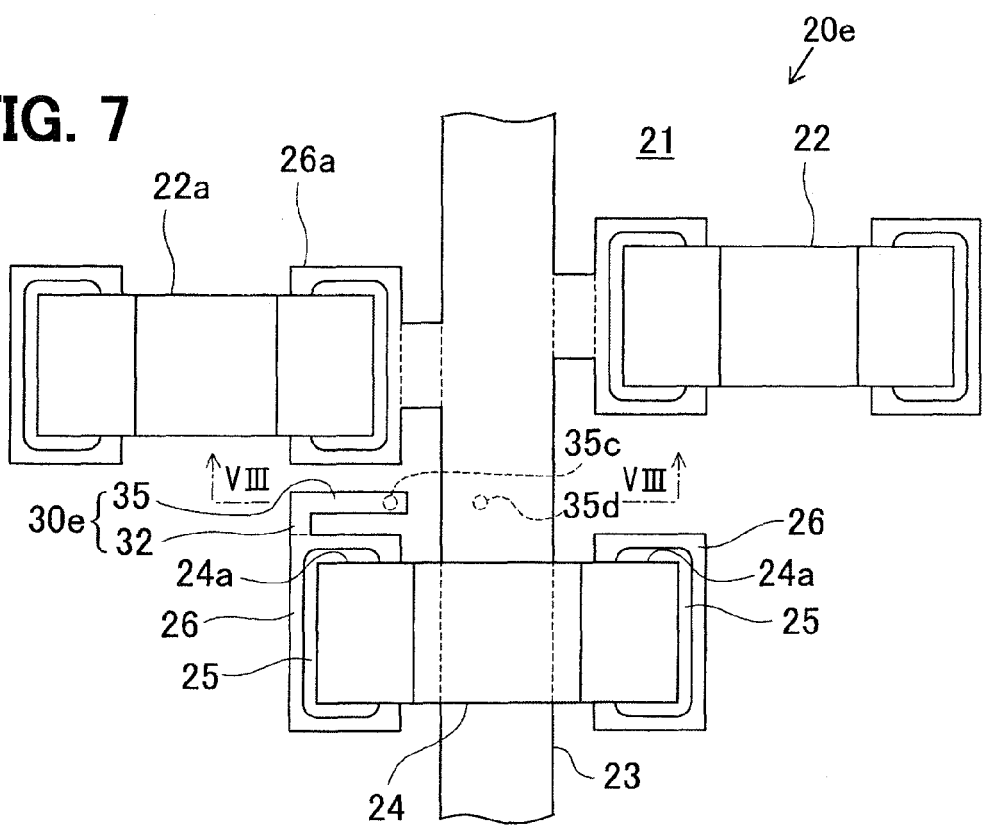
FIG. 7 is a diagram showing a part of a traction control device according to a sixth embodiment of the present disclosure.
Figure 8:
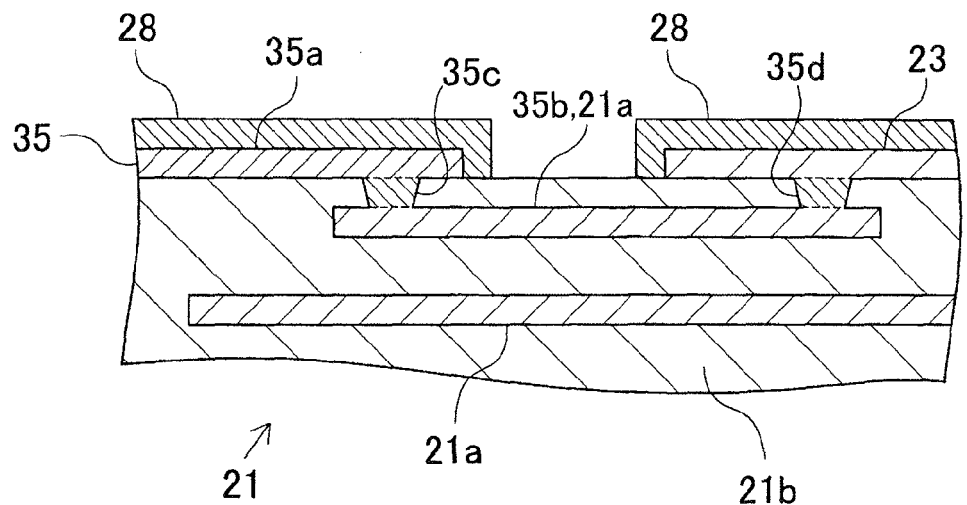
FIG. 8 is a cross-sectional view of the traction control device taken along line VIII-VIII in FIG. 7.

As shown in FIG. 7 and FIG. 8, the circuit substrate 21 includes a plurality of wire layers 21a stacked through an insulating layer 21b. A part of the first wire section 35 of the interrupt wire 30e is provided by a part of the wire layer 21a located inside the circuit substrate 21 (hereafter, referred to as an internal wire portion 35b). The first wire section 35 includes a front wire portion 35a and the internal wire portion 35b coupled by a via portion 35c. The front wire portion 35a is formed on a front side of the circuit substrate 21. The internal wire portion 35b is coupled with the power supply wire 23 by a via portion 35d. On the first wire section 35, a solder resist layer 28 for protecting a surface of the circuit substrate 21 is disposed.

When the internal wire portion 35b is used as a part of the first wire section 35, a wire length of the interrupt wire 30e can be increased without increasing an area occupied by the first wire section 35 on the surface of the circuit substrate 21. Accordingly, the required wire length of the interrupt wire 30e can be secured more efficiently, and a size of the traction control device 20e can be further decreased even when the interrupt wire 30e is disposed on the surface of the circuit substrate 21 on which the electronic components 22 are densely mounted. The above-described configuration of the interrupt wire 30e may be applied to other embodiments and modifications.

Seventh Embodiment

A traction control device 20f according to a seventh embodiment of the present disclosure will be described with reference to FIG. 9.

The traction control device 20f includes a solder resist layer (not shown) that covers the surface of the circuit substrate 21. The solder resist layer defines an opening portion 28a through which at least a part of the interrupt wire 30 is exposed.

Figure 9:
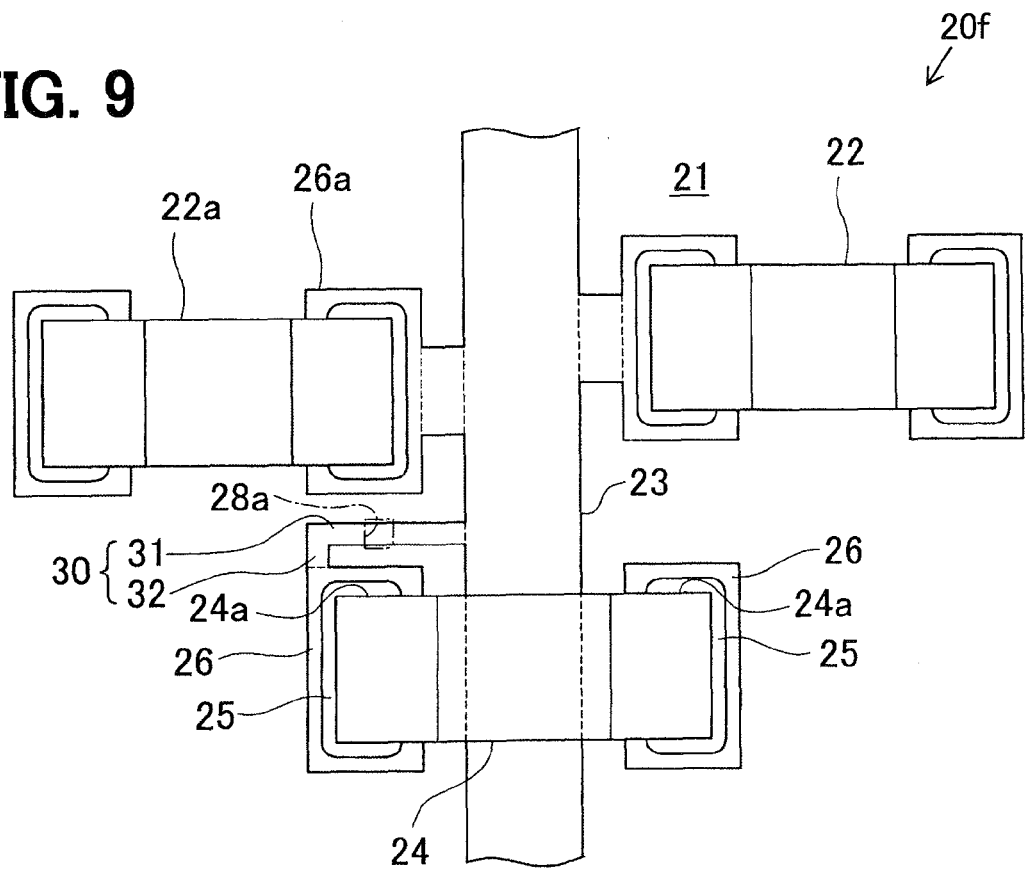
FIG. 9 is a diagram showing a part of a traction control device according to a seventh embodiment of the present disclosure.

As shown in FIG. 9, the solder resist layer defines the opening portion 28a so that the middle portion of the entire length of the interrupt wire 30, which is most likely to generate heat, is exposed outside. Reasons of providing the opening portion 28a will be described with reference to FIG. 10 and FIG. 11.

Figure 10:
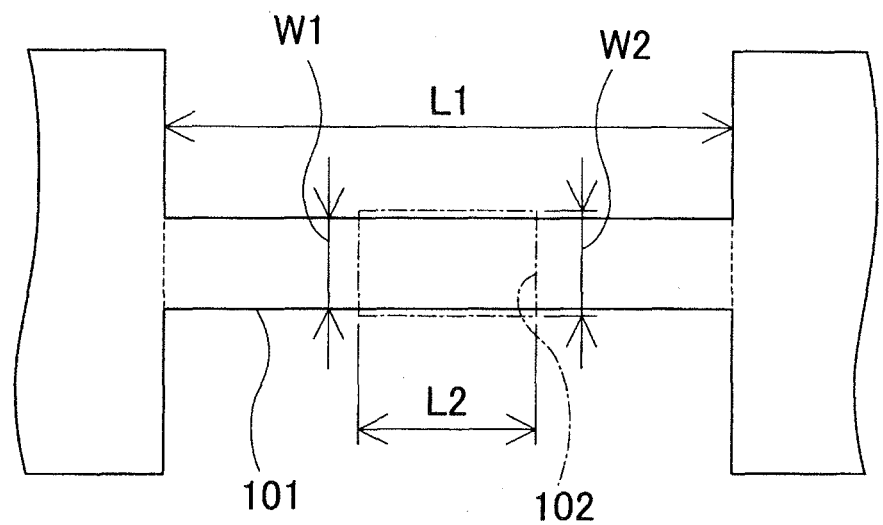
FIG. 10 is a diagram showing a device including a test interrupt wire and a test opening portion.

In a device shown in FIG. 10, a part of a test interrupt wire 101 is exposed outside through a test opening portion 102 defined by a solder resist layer. The test interrupt wire 101 is supplied with a predetermined current, and an interrupting current I with which the test interrupt wire 101 melts and a melting time t when the test interrupt wire 101 melts are measured. Furthermore, an interrupting current I and a melting time t of a test interrupt wire 101 in a case where a solder resist layer does not define a test opening portion 102 are also measured. The test interrupt wire 101 has an entire length L1 of 2.85 mm and has a width W1 of 0.25 mm. The test opening portion 102 has an opening length L2 of 0.6 mm in a direction parallel to a length direction of the test interrupt wire 101 and has an opening width W2 of 0.25 mm in a width direction of the test interrupt wire 101. In FIG. 10, the opening width W2 is drawn as being longer than the width W1 for convenience of drawing.

Figure 11:
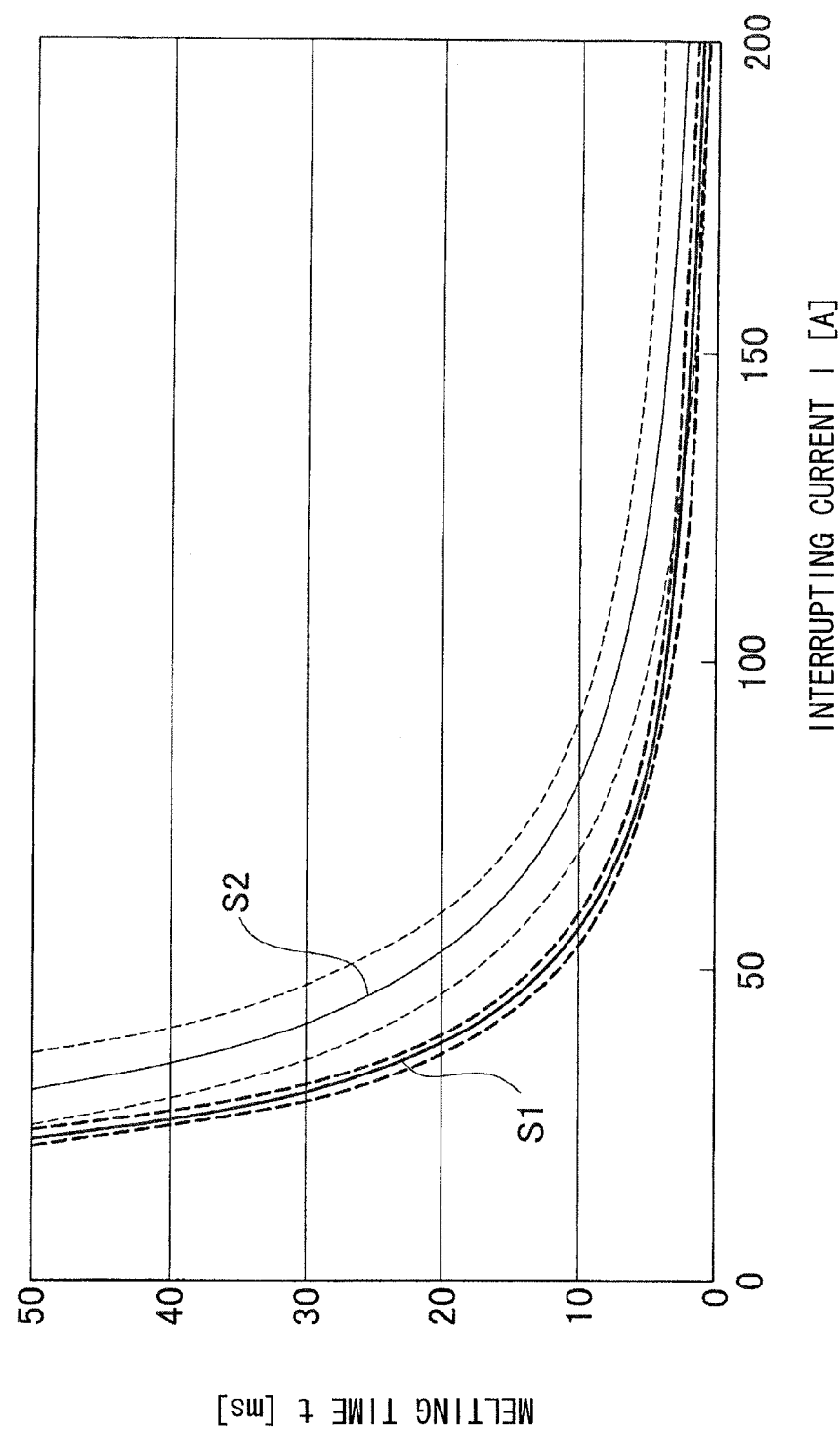
FIG. 11 is a graph showing a relationship between an interrupting current and a melting time of the test interrupt wire in each case where the test opening portion is defined and where test opening portion is not defined.

In FIG. 11, a bold solid line S1 shows a relationship between the interrupting current I and the melting time t of the test interrupt wire 101, a part of which is exposed through the test opening portion 102, and a range between bold dashed lines centered on the bold solid line S1 shows a variation range of the melting time t with respect to the interrupting current I. A thin solid line S2 shows a relationship between the interrupting current I and the melting time t of the test interrupt wire 101 in a case where a test opening portion 102 is not defined, and a range between thin dashed lines centered on the thin solid line S2 shows a variation range of the melting time t with respect to the interrupting current I.

As shown in FIG. 11, at the same interrupting current, the melting time t decreases and the variation range decreases when the test opening portion 102 is defined by the solder resist layer. In contrast, in the case where the test opening portion 102 is not defined by the solder resist layer, the melting time t of the test interrupt wire 101 increases in each overcurrent range and the variation range increases compared with the case where the test opening portion 102 is defined. This is because a melt conductor generated by melting of the test interrupt wire 101 flows from the test opening portion 102 and the melt conductor is less likely to stay at a position of the test interrupt wire 101 before melting.

Thus, when at least a part of the interrupt wire 30 is exposed through the opening portion 28a, the melting time t decreases, the overcurrent protection action can be achieved early, and a temperature rise of a protected component can be restricted. Furthermore, a time for which a voltage of the power supply wire 23 decreases due to interruption by the interrupt wire 30 can be reduced. In addition, because the variation of the melting time t decreases, a capacity of a stabilizing capacitor that is designed in view of the melting time of the interrupt wire 30 in each device or each circuit can be reduced, and a cost and a size can be reduced. Furthermore, because the melting time t decreases also in a rated region of current, a circuit can be designed more freely.

Thus, when the interrupt wire 30 melts in accordance with heat generated by the overcurrent, a melt conductor generated by melting of the interrupt wire 30 flows from the opening portion 28a. Accordingly, the melt conductor is less likely to stay at a position of the interrupt wire 30 before melting, variations in the melt position and the melting time due to stay of the melt conductor can be restricted, and a decrease in an interruption performance by the interrupt wire 30 can be restricted. The above-described configuration of the opening portion 28a, through which at least a part of the interrupt wire 30 is exposed, may be applied to other embodiments and modifications.

A traction control device 20f according to a first modification of the seventh embodiment will be described with reference to FIG. 12. A traction control device 20f according to a second modification of the seventh embodiment will be described with reference to FIG. 13. A traction control device 20f according to a third modification of the seventh embodiment will be described with reference to FIG. 14A and FIG. 14B.

Figure 12:
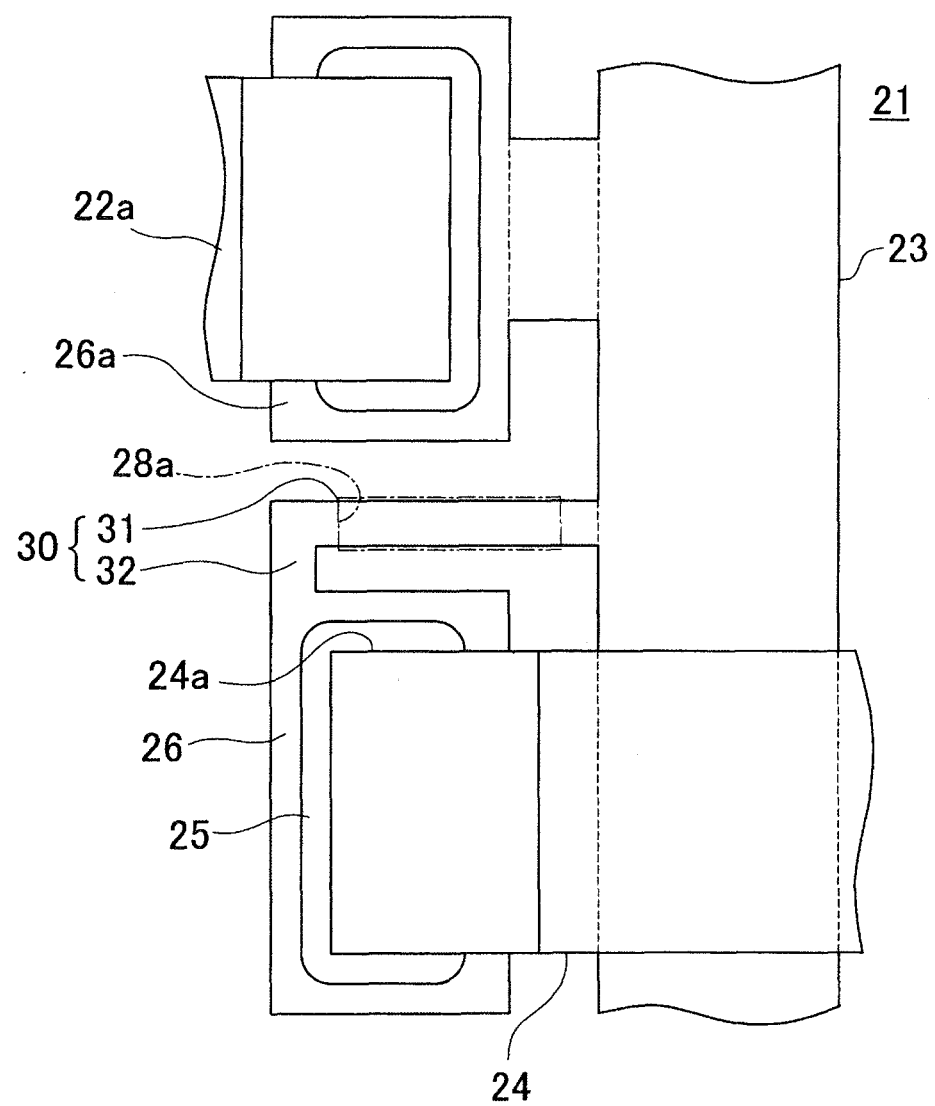
FIG. 12 is a diagram showing a part of a traction control device according to a first modification of the seventh embodiment.

As shown in FIG. 12, the opening portion 28a may also be defined by the solder resist layer in such a manner that not only the middle portion but also a portion of the interrupt wire 30 other than the middle portion is exposed outside through the opening portion 28a. In this case, the melt conductor generated by melting of the interrupt wire 30 is likely to adhere to the portion other than the middle portion in the opening portion 28a. Accordingly, the melt conductor is less likely to stay, and the melt conductor of high temperature is less likely to flow from the opening portion 28a and to influence other electronic components 22a.

Figure 13:
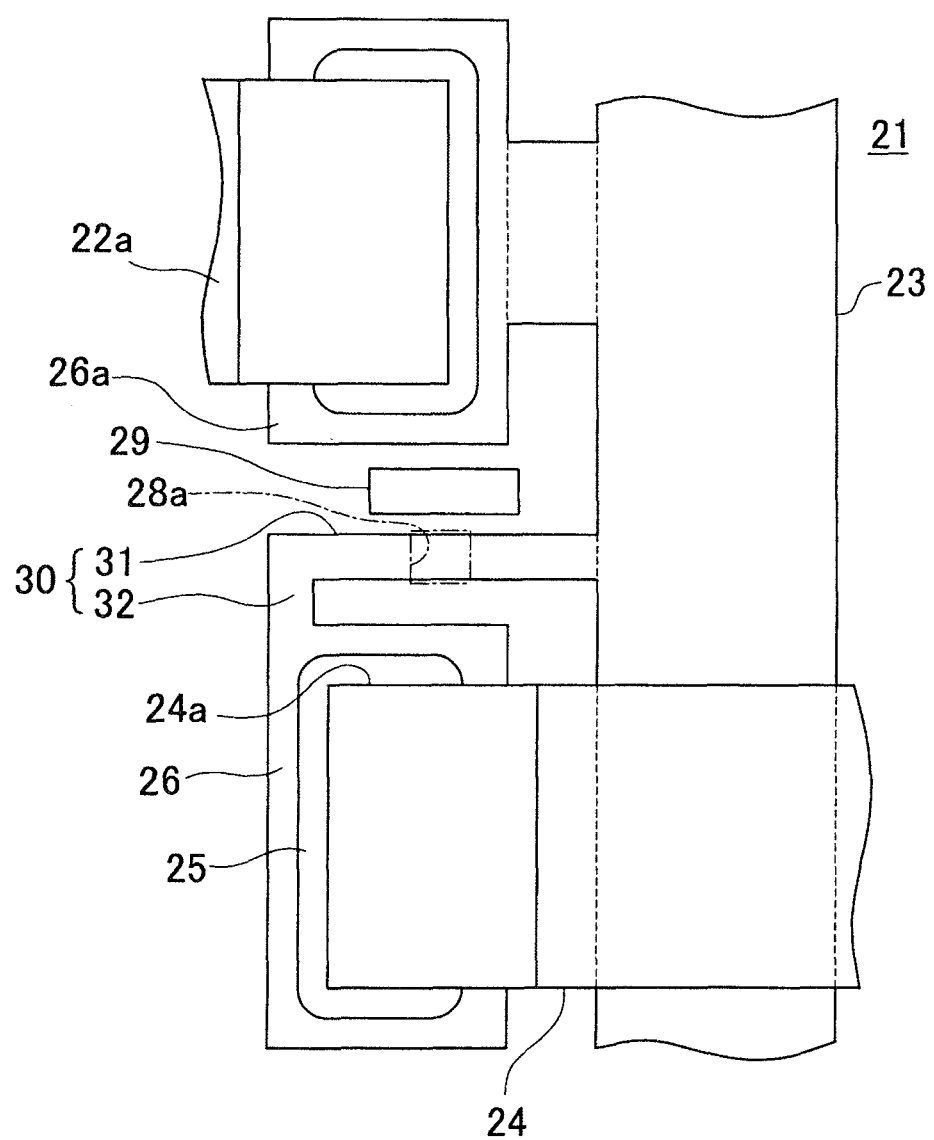
FIG. 13 is a diagram showing a part of a traction control device according to a second modification of the seventh embodiment.

As shown in FIG. 13, an adherent wire 29 may be disposed adjacent to the interrupt wire 30. The adherent wire 29 can work as an adherent member or an adsorption member to which the melt conductor generated by melting of the interrupt wire 30 adheres. The adherent wire 29 may be made of the same material as the power supply wire 23. When the melt conductor of the high temperature is generated by melting of the interrupt wire 30, the melt conductor flow on the surface of the circuit substrate 21 and adheres to the adherent wire 29 adjacent to the interrupt wire 30.

Accordingly, the melt conductor is held by the adherent wire 29 and loses flowability by releasing heat and being hardened. Thus, a decrease in interrupt performance by the interrupt wire 30 can be restricted, and influence of the flow of the melt conductor on other electronic components can be restricted. The adherent wire 29 may be disposed with respect to the interrupt wire 30, a part of which is exposed outside through the opening portion 28a, the adherent wire 29 may also be disposed with respect to the interrupt wire 30 whose surface is fully covered with the solder resist layer 28 without the opening portion 28a, and the adherent wire 29 may also be disposed with respect to the interrupt wire 30 not covered with the solder resist layer 28.

Figure 14A:
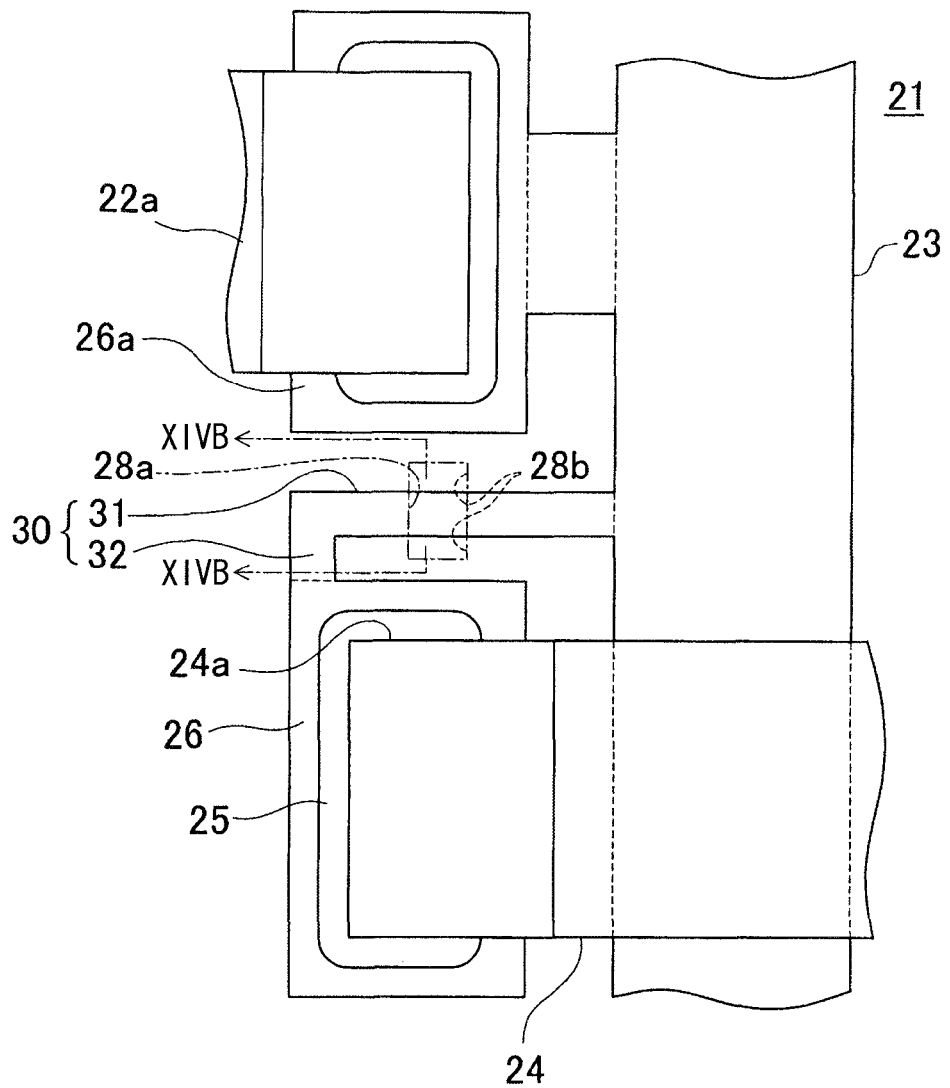
FIG. 14A is a diagram showing a part of a traction control device according to a third modification of the seventh embodiment.
Figure 14B:
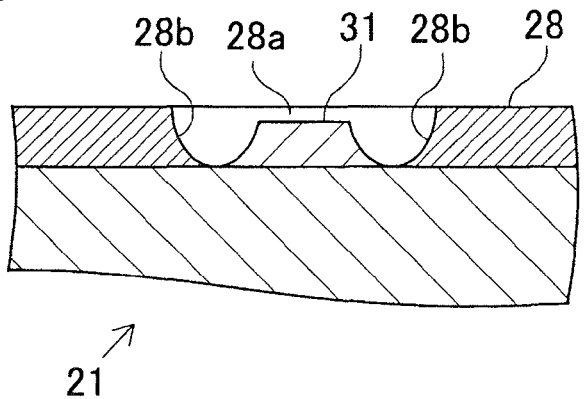
FIG. 14B is a cross-sectional view of the traction control device taken along line XIVB-XIVB in FIG. 14A.

As shown in FIG. 14A and FIG. 14B, the solder resist layer 28 may also define an opening portion 28b in addition to the opening portion 28a in such a manner that a portion adjacent to the interrupt wire 30 is exposed and the opening portion 28b is communicated with the opening portion 28a. For example, the opening portion 28b may be formed by removing a portion of the solder resist layer 28, where a wire section is not formed in a transversely direction (upper to lower direction in FIG. 14A) of the interrupt wire 30, so as to be communicated with the opening portion 28a.

Thus, the melt conductor generated at melting of the interrupt wire 30 flows into the opening portion 28b. Accordingly, the melt conductor is less likely to stay, and the melt conductor at a high temperature is less likely to flow from the opening portion 28a and to influence other electronic components 22a.

In particular, between the first wire section 31 of the interrupt wire 30 and the land 26a, as shown in FIG. 14B, the solder resist layer 28, which provides a wall of the opening portion 28b, is located. Thus, the melt conductor generated by melting of the interrupt wire 30 is less likely to flow from the opening portions 28a, 28b and to influence the land 26a.

Eighth Embodiment

A traction control device 20g according to an eighth embodiment of the present disclosure will be described with reference to FIG. 15.

Figure 15:
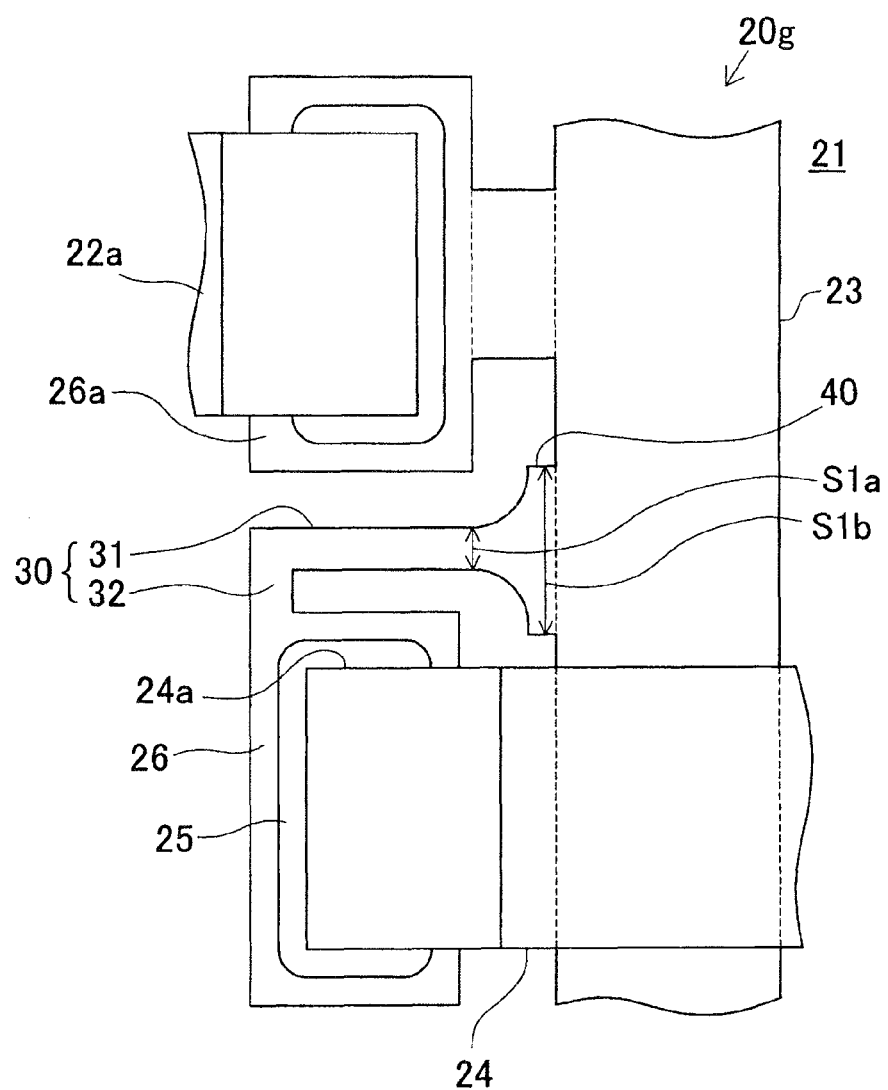
FIG. 15 is a diagram showing a part of a traction control device according to an eighth embodiment of the present disclosure.

As shown in FIG. 15, one end of the interrupt wire 30 is electrically coupled with the power supply wire 23 via a connection wire 40. The connection wire 40 is made of conductive material, such as copper, in a manner similar to the interrupt wire 30 and the power source wire 23. The connection wire 40 has a greater conductor volume than the interrupt wire 30. For example, a wire width of the connection wire 40 increases toward the power source wire 23 in an arc manner (R-shape) so that the a cross-sectional area S1a at an end of the connection wire 40 adjacent to the interrupt wire 30 is smaller than a cross-sectional area S1b at the other end of the connection wire 40 adjacent to the power supply wire 23.

Thus, when heat generated at the interrupt wire 30 by an overcurrent is transmitted to the power supply wire 23 via the connection wire 40, a heat diffusion to the power supply wire 23 can be restricted compared with a case where heat is transmitted directly to the power supply wire 23. Accordingly, a variation in temperature rise in the interrupt wire 30 can be restricted, and the decrease in interrupt performance of the interrupt wire 30 can be restricted. In addition, because the connection wire 40 has the greater conductor volume than the interrupt wire 30, the connection wire 40 can store heat from the interrupt wire 30.

A side end of the connection wire 40 is smoothly connected with a side end of the interrupt wire 30 and the wire width of the connection wire gradually increases toward the power supply wire 23. Because the side end of the interrupt wire 30 and the side end of the connection wire 40 are smoothly connected with each other, when the interrupt wire 30 and the connection wire 40 are formed using etching liquid, the etching liquid can uniformly flow at a connection portion of the side of the interrupt wire 30 and the side end of the connection wire 40. Accordingly, the etching liquid is less likely to stay at the connection portion and a variation in wire width of the interrupt wire can be restricted. Thus, the decrease in interrupt performance by the interrupt wire 30 can be restricted.

The end of the interrupt wire 30 adjacent to the land 26 may be electrically coupled with the land 26 via another connection wire. The connection wire is made of conductive material, such as copper, in a manner similar to the interrupt wire 30. A wire width of the connection wire increases toward the land 26 in an arc manner (R-shape). When heat generated at the interrupt wire 30 by an overcurrent is transmitted to the land 26 via the connection wire, hear required for melting the interrupt wire 30 is not absorbed excessively to the land 26. Accordingly, a variation in temperature rise in the interrupt wire 30 can be restricted, and the decrease in interrupt performance of the interrupt wire 30 can be restricted. In particular, the heat generated at the interrupt wire 30 by the overcurrent is gradually diffused in the connection wire and is widely transmitted to the land 26. Thus, a local temperature rise in the land 26 can be restricted. Therefore, even when a solder having a relatively low melting point is used to the land 26, the solder is less likely to be melted by the heat from the interrupt wire 30. In addition, because the connection wire has a greater conductor volume than the interrupt wire 30, the connection wire can store heat from the interrupt wire 30. The above-described configurations of the connection wire 40 and the connection wire adjacent to the land 26 may be applied to other embodiments and modifications.

Ninth Embodiment

Figure 16:
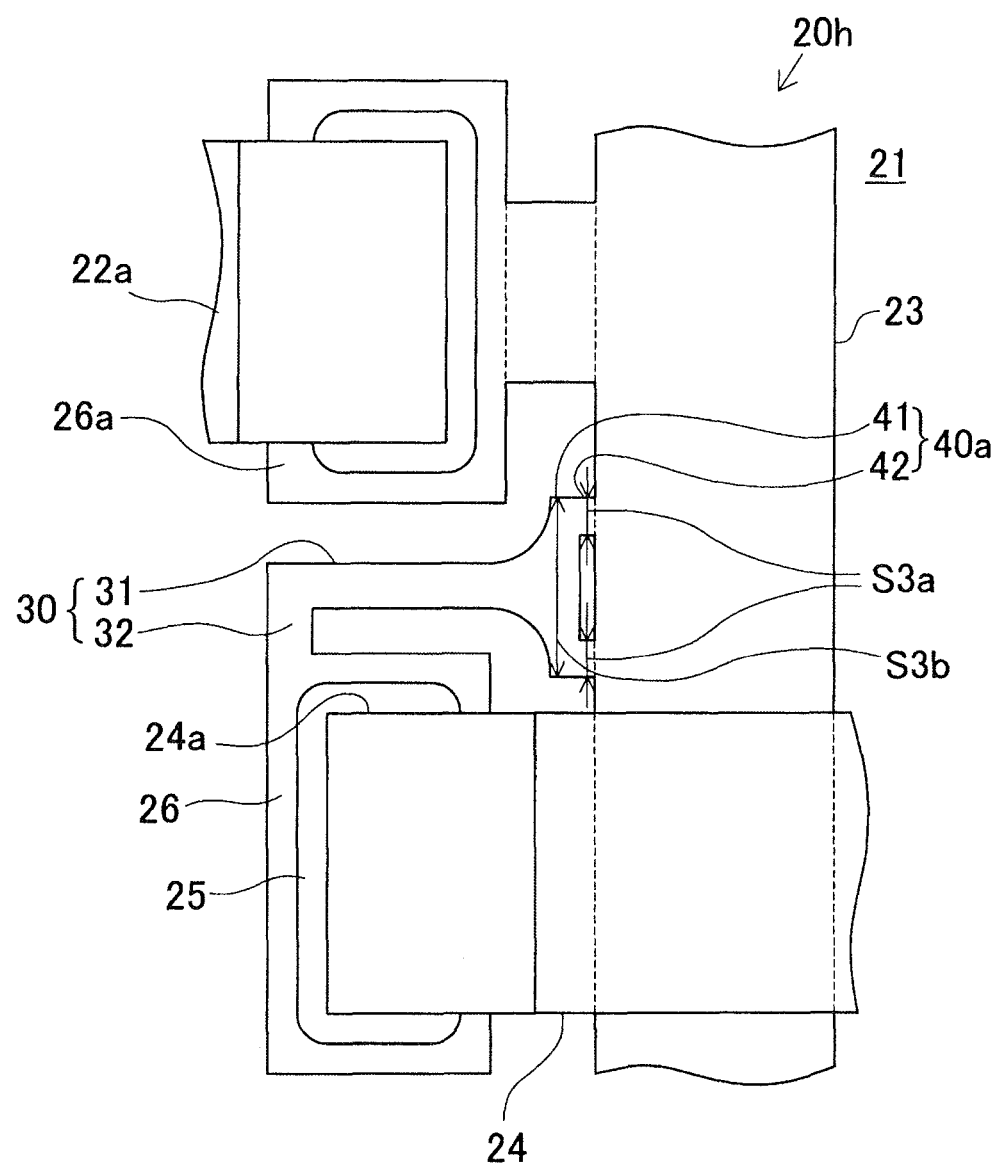
FIG. 16 is a diagram showing a part of a traction control device according to a ninth embodiment of the present disclosure.

A traction control device 20h according to a ninth embodiment of the present disclosure will be described with reference to FIG. 16.

In the present embodiment, the interrupt wire 30 is electrically coupled with the power supply wire 23 via a connection wire 40a.

The connection wire 40a includes a heat storage portion 41 adjacent to the interrupt wire 30 and a narrow-down portion 42 adjacent to the power supply wire 23. The narrow-down portion 42 is designed so that a total cross-sectional area S3a of a connection portion of the connection wire 40a with the power supply wire 23 is smaller than a cross-sectional area of a middle portion of the connection wire 40a, that is, a cross-sectional area S3b of the heat storage portion 41.

Thus, heat transmitted to the connection wire 40a from the interrupt wire 30 is less likely to be transmitted to the power supply wire 23 via the narrow-down portion 42, and the heat storage portion 41 stores heat. Because the heat storage portion 41 stores heat from the interrupt wire 30, when the interrupt wire 30 melts, a temperature of the heat storage portion 41 is relatively high. Thus, the variation in temperature rise in the interrupt wire 30 can be restricted, and the decrease in interrupt performance by the interrupt wire 30 can be restricted with certainty.

By setting the interrupt wire 30 and the connection wire 40a to have a predetermined depth and to be made of a predetermined material, an interrupt condition is fixed so as to restrict the variation, and a pair of the interrupt wire 30 and the connection wire 40a can be widely used. In addition, because a heat storage amount of the connection wire 40a can be controlled with a volume of the heat storage portion 41, the melting time of the interrupt wire 30 can be easily controlled.

Because the connection portion of the connection wire 40a with the power supply wire 23 is formed as the two narrow-down portions 42, when the heat from the interrupt wire 30 is transmitted to the power supply wire 23 via the two narrow-down portions 42, the heat is transmitted to the power supply wire 23 while being diffused in the narrow-down portions 42. Thus, a local temperature rise in the power supply wire 23 can be restricted.

The number of the narrow-down portions 42 of the connection wire 40a may also be one or more than two depending on the interrupt condition.

The end of the interrupt wire 30 adjacent to the land 26 may be electrically coupled with the land 26 via another connection wire that includes a narrow-down portion. Also in this case, the connection wire adjacent to the land 26 can achieve effects similar to the above-described effects of the connection wire 40a. The above-described configurations of the connection wire 40a and the connection wire adjacent to the land 26 may be applied to other embodiments and modifications.

Tenth Embodiment

Figure 17:
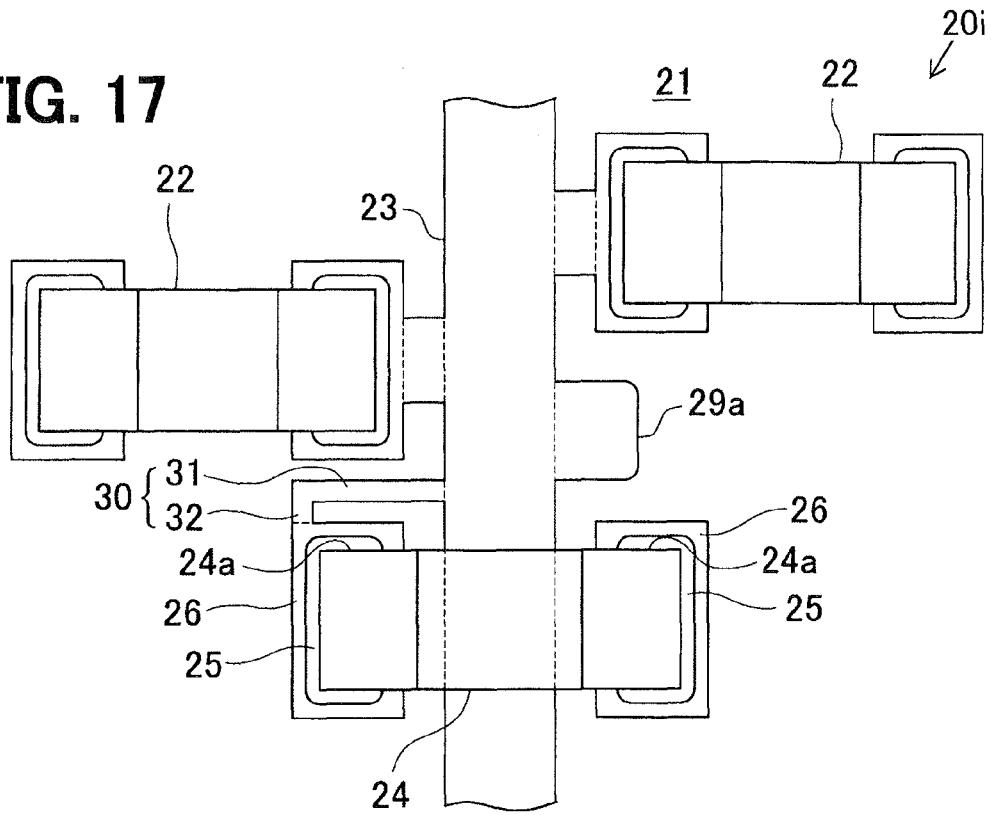
FIG. 17 is a diagram showing a part of a traction control device according to a tenth embodiment of the present disclosure.

A traction control device 20i according to a tenth embodiment of the present disclosure will be described with reference to FIG. 17.

In the present embodiment, the power supply wire 23 is attached with a heat release portion 29a.

The heat release portion 29a is made of the same material as the power supply wire 23. A wiring distance between the interrupt wire 30 and the heat release portion 29a is shorter than wiring distances between the interrupt wire 30 and electronic components 22 except for the electronic component 22 coupled with the interrupt wire 30, that is, the ceramic capacitor 24 in the present embodiment.

Thus, when heat generated at the interrupt wire 30 by an overcurrent is transmitted to the power supply wire 23, the heat is transmitted to the heat release portion 29a and is released. Accordingly, the heat generated at the interrupt wire 30 is less likely to be transmitted to other electronic components 22 coupled with the power supply wire 23. The heat release portion 29a may be formed into a wire shape, or the heat release portion 29a may be provided by a conductive portion formed in a via hole defined by the circuit substrate 21. The above-described configuration of the heat release portion 29a may be applied to other embodiments and modifications.

Figure 18:
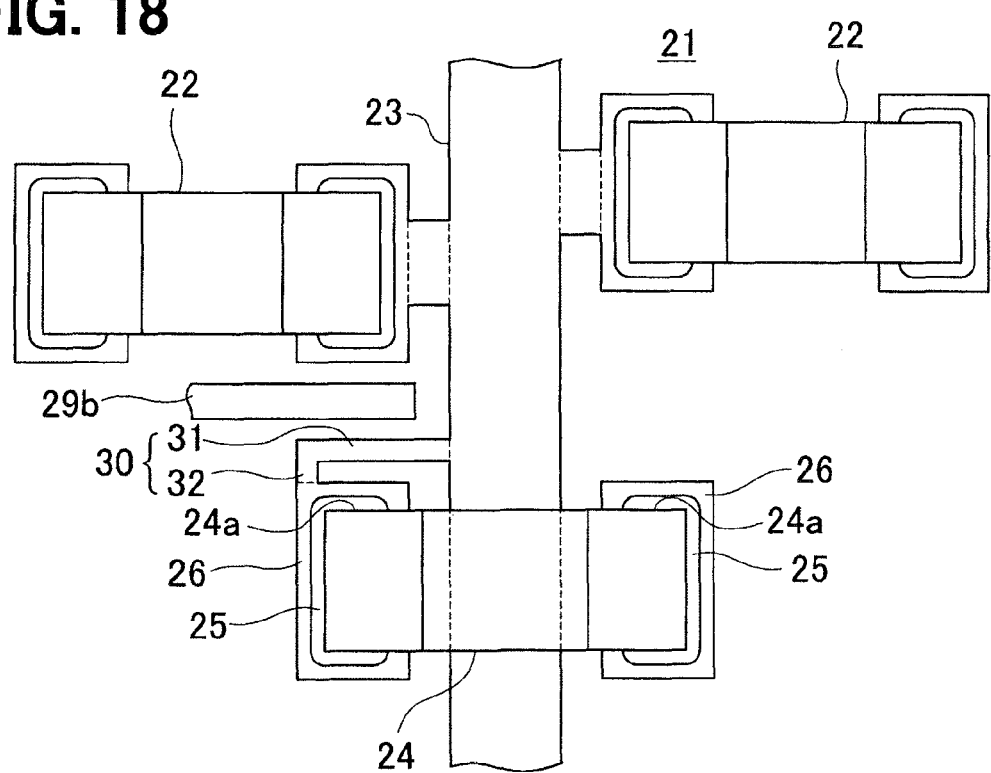
FIG. 18 is a diagram showing a part of a traction control device according to a modification of the tenth embodiment.

A traction control device 20i according to a modification of the tenth embodiment will be described with reference to FIG. 18. As shown in FIG. 18, a heat release wire 29b for releasing heat generated at the interrupt wire 30 by an overcurrent may be disposed adjacent to the interrupt wire 30. Accordingly, the heat generated by the overcurrent is released by the heat release wire 29b, and the heat is less likely to be transmitted to other electronic components 22 to be protected against the heat. Thus, the decrease in interrupt performance by the interrupt wire 30 can be restricted, and normal operation of other electronic components 22 can be maintained.

Eleventh Embodiment

Figure 19:
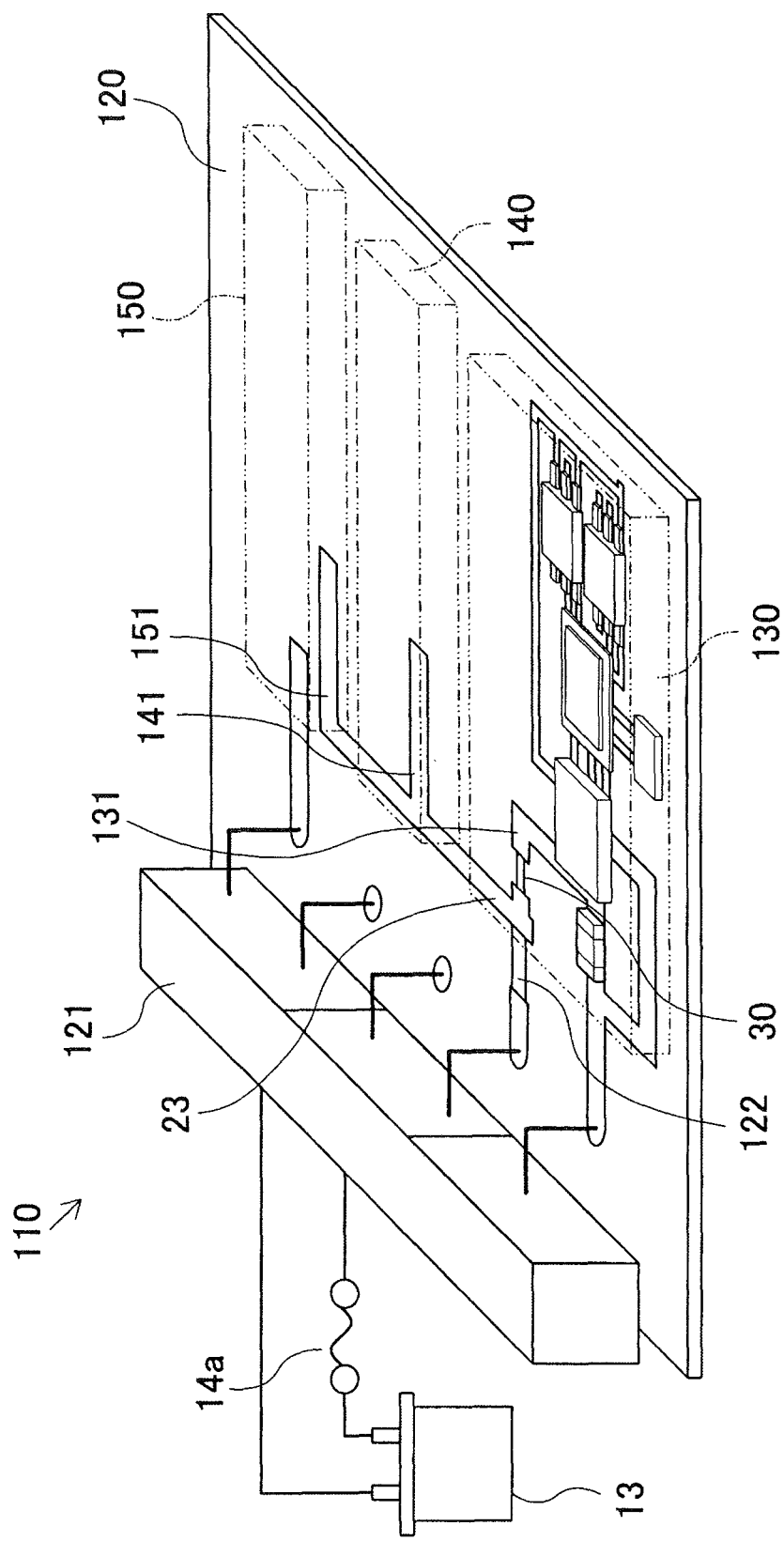
FIG. 19 is a diagram showing a part of an electronic control device according to an eleventh embodiment of the present disclosure.

An electronic control device 110 according to an eleventh embodiment of the present disclosure will be described with reference to FIG. 19. The electronic control device 110 includes a substrate 120 and circuit blocks 130, 140, 150 disposed on the substrate 120. The circuit block 130 performs a similar function to the traction control device 20 according to the first embodiment. The circuit blocks 140, 150 perform different functions from the circuit block 130. The different functions are more important than the function of the circuit block 130. For example, the circuit block 140 performs a function corresponding to the engine ECU, and the circuit block 150 performs a function corresponding to the brake ECU.

The circuit blocks 130, 140, 150 are electrically coupled with the power supply wire 23, which supplies electric power from the battery 13, via branch wires 131, 141, 151, respectively. The above-described interrupt wire 30 is disposed on the branch wire 131 coupled with the circuit block 130 so as to function as overcurrent protection for the circuit block 130. On the power supply wire 23, an interrupt wire 122 that functions as overcurrent protection for the substrate 120 is disposed. In other words, the interrupt wire 122, which protects the substrate 120 including all the circuit blocks 130-150, and the interrupt wire 30, which protects the circuit block 130, are disposed on the substrate 120.

Accordingly, even when overcurrent is caused by a short-circuit fault in the circuit block 130 and the interrupt wire 30 melts due to the overcurrent, the circuit blocks 140, 150 are still electrically coupled with the power supply wire 23 via the branch wires 141, 151. Thus, only the circuit block 130 coupled with the melt interrupt wire 30 stops and the circuit blocks 140, 150 keep operating. In particular, since the function of the circuit block 130 is less important than the functions of the circuit blocks 140, 150, influence of the stop of the less important circuit block 130 on the functions of the more important circuit blocks 140, 150 can be restricted. When an overcurrent is caused by a short-circuit fault in the circuit blocks 140, 150 without the interrupt wire 30, the overcurrent flows to the power supply wire 23, the interrupt wire 122 melts, and the circuit blocks 130, 140, 150 are deactivated. Thus, the overcurrent is less likely to flow to other circuit block.

Especially in a case where a wire width of the interrupt wire 30 is smaller than a wire width of the interrupt wire 122 so that a current value at interruption by the interrupt wire 30 is smaller than a current value at interruption by the interrupt wire 122, when an overcurrent is caused by a short-circuit fault in the circuit block 130, the interrupt wire 30 melts earlier than the interrupt wire 122 with certainty. Thus, the influence on other circuit blocks 140, 150 can be restricted with certainty. The above-described configuration including two interrupt wires on one substrate may be applied to other embodiments and modifications.

Other Embodiments

The present invention is not limited to the above-described embodiments and the above-described modifications may include various changes and modifications. For example, each of the above-described interrupt wires 30, 30a-30e may be electrically coupled with the common wire, which is shared by the electronic components 22 to be protected against overcurrent, instead of the power supply wire 23.

Each of the above-described interrupt wires 30, 30a-30e may also be electrically coupled with a component-mounted wire on which an electronic component is disposed, such as an internal layer fully covered with a protective layer made of, for example, solder resist.

Each of the above-described interrupt wires 30, 30a-30e may be provided for each substrate for overcurrent protection of the electronic control devices 12 including the engine ECU, the brake ECU, the steering ECU, the body ECU, and the navigation ECU.

At least a part of the interrupt wire 30 may be made of material, such as aluminum, having a lower thermal conductivity than the power supply wire 23 and the land 26. Accordingly, heat generated at the interrupt wire 30 by an overcurrent is less likely to be transmitted to the power supply wire 23 and the land 26, the variation in temperature rise of the interrupt wire 30 can be restricted, and the decrease in interrupt performance by the interrupt wire 30 can be restricted with certainty. Also each of the interrupt wires 30a-30e may be made of material having a lower thermal conductivity than the power supply wire 23 and the land 26 so as to achieve similar effects.

What is claimed is:

1. An electronic control device comprising:
   a substrate;
   a plurality of component-mounted wires disposed on the substrate;
   a plurality of electronic components mounted on the respective component-mounted wires;
   a common wire disposed on the substrate and coupled with each of the electronic components; and
   an interrupt wire coupled between one of the component-mounted wires and the common wire, the interrupt wire configured to melt in accordance with heat generated by an overcurrent so as to interrupt a connection between the one of the component-mounted wires and the common wire via the interrupt wire, the interrupt wire including a first wire section and a second wire section that is shorter than the first wire section, the first wire section and the second wire section coupled with each other at a predetermined angle, the predetermined angle determined so that the first wire section is coupled with the common wire and the second wire section is coupled with the one of the component-mounted wires, wherein
   the first wire section includes a narrow portion at a middle portion of an entire length of the interrupt wire including the first wire section and the second wire section, and a wire width of the narrow portion is less than a wire width of the remaining first wire section,
   the first wire section extends perpendicularly to a longitudinal direction of the common wire, and
   the second wire section extends in parallel with the longitudinal direction of the common wire.

2. The electronic control device according to claim 1, wherein one of the electronic components includes a terminal disposed on the one of the component-mounted wires, and
wherein the interrupt wire is coupled with a peripheral portion of the one of the component-mounted wires at a position distant from the terminal.

3. The electronic control device according to claim 1, wherein another of the component-mounted wires is disposed adjacent to the one of the component-mounted wires, and
wherein the interrupt wire is disposed between the one of the component-mounted wires and the another of the component-mounted wires.

4. The electronic control device according to claim 1, wherein one of the electronic components is mounted on the one of the component-mounted wires and another of the component-mounted wires, and
wherein the common wire is disposed between the one of the component-mounted wires and the another of the component-mounted wires.

5. The electronic control device according to claim 1, wherein the common wire is a power supply wire.

6. A control system comprising:
   a power supply path coupled with a power source;
   a fuse disposed on the power supply path;
   a device coupled with the power source by the power supply path via the fuse; and
   the electronic control device according to claim 5,
   wherein the power supply wire in the electronic control device is coupled with the power source by the power supply path via the fuse.

7. The electronic control device according to claim 1, wherein the interrupt wire is configured to melt in accordance with the heat generated by an overcurrent that is less than a fuse melting current.

* * * * *